(12) United States Patent
Coleman et al.

(10) Patent No.: US 9,362,711 B2
(45) Date of Patent: Jun. 7, 2016

(54) PHASE-CONTINUOUS TUNABLE LASER

(71) Applicant: Keysight Technologies, Inc., Minneapolis, MN (US)

(72) Inventors: Christopher L. Coleman, Santa Clara, CA (US); Gregory Douglas Vanwiggeren, San Jose, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 263 days.

(21) Appl. No.: 13/736,388

(22) Filed: Jan. 8, 2013

(65) Prior Publication Data
US 2013/0195129 A1     Aug. 1, 2013

Related U.S. Application Data

(60) Provisional application No. 61/592,083, filed on Jan. 30, 2012.

(51) Int. Cl.
  *H01S 3/10*    (2006.01)
  *H01S 3/107*    (2006.01)
  *H01S 5/14*    (2006.01)
  *H01S 3/16*    (2006.01)
  *H01S 5/065*    (2006.01)

(52) U.S. Cl.
CPC .............. *H01S 3/10053* (2013.01); *H01S 3/107* (2013.01); *H01S 5/141* (2013.01); *H01S 3/1608* (2013.01); *H01S 5/0653* (2013.01); *H01S 5/0654* (2013.01); *H01S 5/142* (2013.01); *H01S 5/143* (2013.01)

(58) Field of Classification Search
CPC ....... H01S 3/109; H01S 5/0092; H01S 5/141; H01S 5/02446; H01S 3/0014; H01S 3/0092; H01S 3/0627; H01S 3/06754; H01S 3/09415; H01S 5/005; H01S 5/0078; H01S 5/02252
USPC .................................................... 372/20, 102
See application file for complete search history.

(56) References Cited

U.S. PATENT DOCUMENTS

| | | | | |
|---|---|---|---|---|
| 4,229,710 | A | * | 10/1980 | Shoshan ................ H01S 3/0812 359/571 |
| 4,719,636 | A | * | 1/1988 | Yamaguchi .............. 372/50.121 |
| 4,979,235 | A | * | 12/1990 | Rumbaugh et al. ........... 398/205 |

(Continued)

FOREIGN PATENT DOCUMENTS

WO    WO2009075154    6/2009

OTHER PUBLICATIONS

F J Duarte, "Tunable Lasers Handbook", ISBN: 978-0-12-222695-3, p. 409, 1995.*

(Continued)

*Primary Examiner* — Tod T Van Roy
*Assistant Examiner* — Vu A Vu

(57) ABSTRACT

A tunable laser comprises a first tuner configured to select an emission wavelength of the laser; a second tuner configured to adjust a cavity mode of the laser by modifying the cavity optical path length. The second tuner is constrained by a finite tuning range. The tunable laser also comprises a controller configured to control the first and second tuners to select the emission wavelength and adjust the cavity mode in synchronization to perform phase-continuous tuning across a range larger than supported by the finite tuning range of the second tuner.

16 Claims, 13 Drawing Sheets

(56) References Cited

U.S. PATENT DOCUMENTS

| | | | |
|---|---|---|---|
| 5,408,492 A * | 4/1995 | Vossler et al. | 372/94 |
| 5,594,592 A * | 1/1997 | Harlamoff et al. | 359/330 |
| 6,108,355 A * | 8/2000 | Zorabedian | 372/20 |
| 6,282,215 B1 | 8/2001 | Zorabedian et al. | |
| 6,526,071 B1 * | 2/2003 | Zorabedian et al. | 372/20 |
| 6,901,088 B2 * | 5/2005 | Li et al. | 372/20 |
| 6,940,879 B2 * | 9/2005 | Zhang | 372/20 |
| 7,099,359 B2 * | 8/2006 | Griffin | 372/26 |
| 7,197,208 B2 * | 3/2007 | Trutna et al. | 385/37 |
| 7,209,498 B1 * | 4/2007 | Chapman et al. | 372/20 |
| 7,286,209 B1 * | 10/2007 | Hopwood et al. | 356/4.01 |
| 7,474,406 B2 * | 1/2009 | Feugnet et al. | 356/459 |
| 7,720,116 B2 * | 5/2010 | Anderson | H01S 5/143 372/20 |
| 2003/0021305 A1 | 1/2003 | Lundqvist | |
| 2005/0226284 A1 | 10/2005 | Tanaka et al. | |
| 2006/0013273 A1 | 1/2006 | Menon et al. | |
| 2006/0050750 A1 * | 3/2006 | Barty | 372/25 |
| 2006/0072634 A1 | 4/2006 | Daiber | |
| 2006/0140228 A1 | 6/2006 | McDonald et al. | |
| 2006/0193354 A1 | 8/2006 | Rosenblatt | |
| 2008/0025349 A1 | 1/2008 | Mizutani et al. | |
| 2010/0054756 A1 * | 3/2010 | Nishihara | H04B 10/5051 398/185 |
| 2010/0202785 A1 * | 8/2010 | Kawanishi et al. | 398/185 |
| 2011/0002349 A1 | 1/2011 | Mizutani et al. | |

OTHER PUBLICATIONS

Trutna, et al., "Continuously tuned external cavity semiconductor laser," Journal of Lightwave Technology, vol. 11, No. 8, 1279-1286 (1993).

Thaniyavarn, "Wavelength-independent, optical-damage-immune LiNbO3 TE—TM mode converter," Optics Letters, vol. 11, No. 1, 39-41, (1986).

Noe, et al., "Integrated-optic rotating waveplate frequency shifter," Electronics Letters, vol. 24, No. 21, 1348-1349, (1988).

Search Report mailed Apr. 28, 2014 in French Patent Application No. FR1262553.

* cited by examiner

PHASE-CONTINUOUS TUNABLE LASER

CROSS-REFERENCE TO RELATED APPLICATIONS

The present application claims priority under 35 U.S.C. §119(e) from U.S. Provisional Patent Application No. 61/592,083 filed on Jan. 30, 2012 and assigned to the present assignee. The entire disclosure of U.S. Provisional Patent Application No. 61/592,083 is specifically incorporated herein by reference.

BACKGROUND

Tunable lasers are used to generate laser light at different wavelengths. Such lasers can be employed in a variety of technical applications, such as optical communications, spectroscopy, and photochemistry, to name but a few. As one example, an optical communication system may use a tunable laser to transmit data through different communication channels using wavelength division multiplexing.

A tunable laser typically comprises a cavity that recirculates and amplifies selected wavelengths of an optical field to produce a laser beam. The cavity typically comprises a wavelength filter that selects wavelengths to be amplified by the cavity and again element that amplifies the selected wavelengths. As examples, the wavelength filter can be implemented by a diffraction grating and the gain element can be implemented by a semiconductor optical amplifier (SOA).

The tuning range of the laser is generally determined by properties of the cavity such as its gain spectrum and cavity modes. The gain spectrum of the cavity defines a set of wavelengths that are amplified as the optical field recirculates. To produce lasing action, a wavelength must fall within the gain spectrum so that it is amplified during the recirculation. The gain spectrum is generally determined by properties of a gain element and any lossy elements in the cavity. The cavity modes, on the other hand, define a discrete set of wavelengths that resonate within the cavity based on their relationship to the cavity's optical length. To produce lasing action, a wavelength must belong to one of the cavity's cavity modes in addition to fatting within the gain spectrum. A wavelength belongs to a cavity mode if a round trip path through the cavity is equal to an integer multiple of the wavelength. Because the cavity modes relate to the optical length of the cavity, they can be modified by adjusting this length.

When a laser is tuned between different wavelengths, its output may exhibit discontinuities due to so-called "mode hops" between different cavity modes. For example, if the laser is tuned from a first wavelength corresponding to a first cavity mode to a second wavelength corresponding to a second cavity mode, the output of the laser may be interrupted as the tuning passes through intermediate wavelengths that do not belong to any of the laser's cavity modes. The laser can also experience discontinuities due to phase differences between successively output wavelengths. For example, if the laser is tuned from between successive wavelengths that are out of phase with each other, the resulting output may be distorted or undefined at certain points.

The discontinuities caused by mode hops or phase differences can hinder the performance of certain applications. For instance, in optical test instrumentation, it can be useful to perform a continuous wavelength sweep with a tunable laser to test an optical device's performance over a full range of wavelengths. However, these discontinuities generally prevent the sweep from being performed for all of the wavelengths, and they can introduce noise into the resulting measurements.

To avoid these and other limitations, researchers have developed lasers that can be tuned in a phase-continuous manner (i.e., without mode hops and in phase) by adjusting their cavity modes to compensate for changes in wavelengths. For instance, when a phase-continuous tunable laser is tuned from a first wavelength to a second wavelength, the cavity's optical length can be adjusted together with the selected wavelength in order to avoid mode hops and ensure that the second wavelength is output in phase with the first wavelength.

FIG. 1 is a diagram illustrating a conventional cavity that can be used to implement a continuously tunable laser. In the example of FIG. 1, the cavity has a Littrow configuration, but it could be modified to have other configurations, such as a Littman-Metcalf configuration.

Referring to FIG. 1, a cavity 100 comprises an optical amplifier 105, a collimating lens 110, and a diffraction grating 115. Optical amplifier 105 has a partially reflective mirror 125 at one end and an anti-reflective coating 130 at another end. An emission wavelength of cavity 100 is tuned by rotating diffraction grating 115 about a precisely defined pivot point 135.

During operation, optical amplifier 105 amplifies an optical field traveling along an optical axis 120. The optical field is collimated by collimating lens 110 and reflected off of diffraction grating 115. The reflected optical field recirculates back through collimating lens 110, penetrates anti-reflective coating 130, and then arrives at partially reflective mirror 125. A fraction of the optical field's power transmits through partially reflective mirror 125 and is collected as the optical output of the laser.

Diffraction grating 115 is typically mounted to a motor-actuated stage to rotate it around pivot point 135. Diffraction grating 115 acts as both a tunable filter, to coarsely select the lasing wavelength, and as a cavity mode tuner, to finely select the lasing wavelength. Diffraction grating 115 selects a different coarse wavelength by changing its angle of incidence relative to optical axis 120, and it selects a different fine wavelength through a translation that changes the length of cavity 100. Rotation about the precisely defined pivot point 135 simultaneously produces the proper amounts of angle tuning and translational tuning so that the output laser wavelength is swept in a phase-continuous way via a single actuation. An example of this design is disclosed in Trutna, W. R., and L. F. Stokes, "Continuously tuned external cavity semiconductor laser," *Journal of Lightwave Technology*, v 11, n 8, 1279-1286 (1993), the disclosure of which is hereby incorporated by reference.

The design of cavity 100 is attractive in part due to its mechanical simplicity, particularly its ability to continuously tune a laser using a single mechanical motion. Nevertheless, the design of cavity 100 also has significant drawbacks.

One drawback of cavity 100 is that it has minimal error tolerance with respect to the positioning of diffraction grating 115. In particular, diffraction grating 115 must retain its precise alignment relative to pivot point 135 or the tuning mechanism will become corrupted. This can be difficult to achieve through the passage of time, changes in the device's environment, and potentially disruptive activities such as shipping. Accordingly, to avoid potential misalignments, cavity 100 generally must be built through a highly accurate, yet expensive and time consuming process.

Another drawback of cavity 100 is that the mechanical tuning mechanism tends to limit the speed of tuning. In particular, the offset pivot point 135 necessitates indirect motor drive mechanisms, which typically involve mechanical components with a great deal of inertia and low resonance frequencies, such as a mechanical level arm. These characteristics necessitate slower sweep speeds and lower repetition rates.

Yet another drawback of cavity 100 is that the required pivot point may shift as a laser is tuned over a wide spectral range. This is due in part to the cavity's inability to compensate for dispersion as the tuning occurs. Consequently, more elaborate mechanical schemes become required to maintain phase-continuous tuning over the full spectral range.

In light of these and other drawbacks of conventional technologies, there is a need for more efficient, flexible, and cost effective approaches for phase-continuous laser tuning over a broad range of wavelengths.

SUMMARY

In accordance with a representative embodiment, a tunable laser comprises: a first tuner configured to select an emission wavelength of the laser; a second tuner configured to adjust a cavity mode of the laser by modifying the cavity optical path length. The second tuner is constrained by a finite tuning range. The tunable laser also comprises a controller configured to control the first and second tuners to select the emission wavelength and adjust the cavity mode in synchronization to perform phase-continuous tuning across a range larger than supported by the finite tuning range of the second tuner.

In accordance with another representative embodiment, a method of operating a tunable laser comprising a first timer and a second tuner comprises: controlling the first tuner to select an emission wavelength of the laser; controlling the second tuner to adjust a cavity mode of the laser by modifying the cavity optical path length. The second tuner is constrained by a finite tuning range. The method also comprises controlling the first and second tuners in synchronization with each other to modify the selected emission wavelength in a phase-continuous manner across a range that is larger than supported by the finite tuning range of the second tuner.

BRIEF DESCRIPTION OF THE DRAWINGS

The described embodiments are best understood from the following detailed description when read with the accompanying drawing figures. Wherever applicable and practical, like reference numerals refer to like elements.

DETAILED DESCRIPTION

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claim set. Moreover, descriptions of well-known apparatuses and methods may be omitted so as to not obscure the description of the representative embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly indicates otherwise. Thus, for example, 'a device' includes one device and plural devices.

As used in the specification and appended claims, and in addition to their ordinary meanings, the terms 'substantial' or 'substantially' mean to within acceptable limits or degree.

The present teachings relate generally to tunable lasers and related methods of operation. For example, in some embodiments, a phase-continuous tunable laser comprises a laser cavity having a coarse tuning mechanism (or first tuner), a fine tuning mechanism (or second tuner), and a controller that controls the coarse and fine tuning mechanisms to perform tuning in synchronization. The coarse tuning mechanism can comprise, for example, a wavelength the fine tuning mechanism can comprise, for example, a cavity mode tuner, and the controller can electronically control the wavelength filter and the cavity mode tuner to perform wavelength selection and cavity mode adjustment in synchronization. The combination of these features and their synchronized operation allows the laser to be tuned substantially without mode hops or phase discontinuities.

Figure 1:
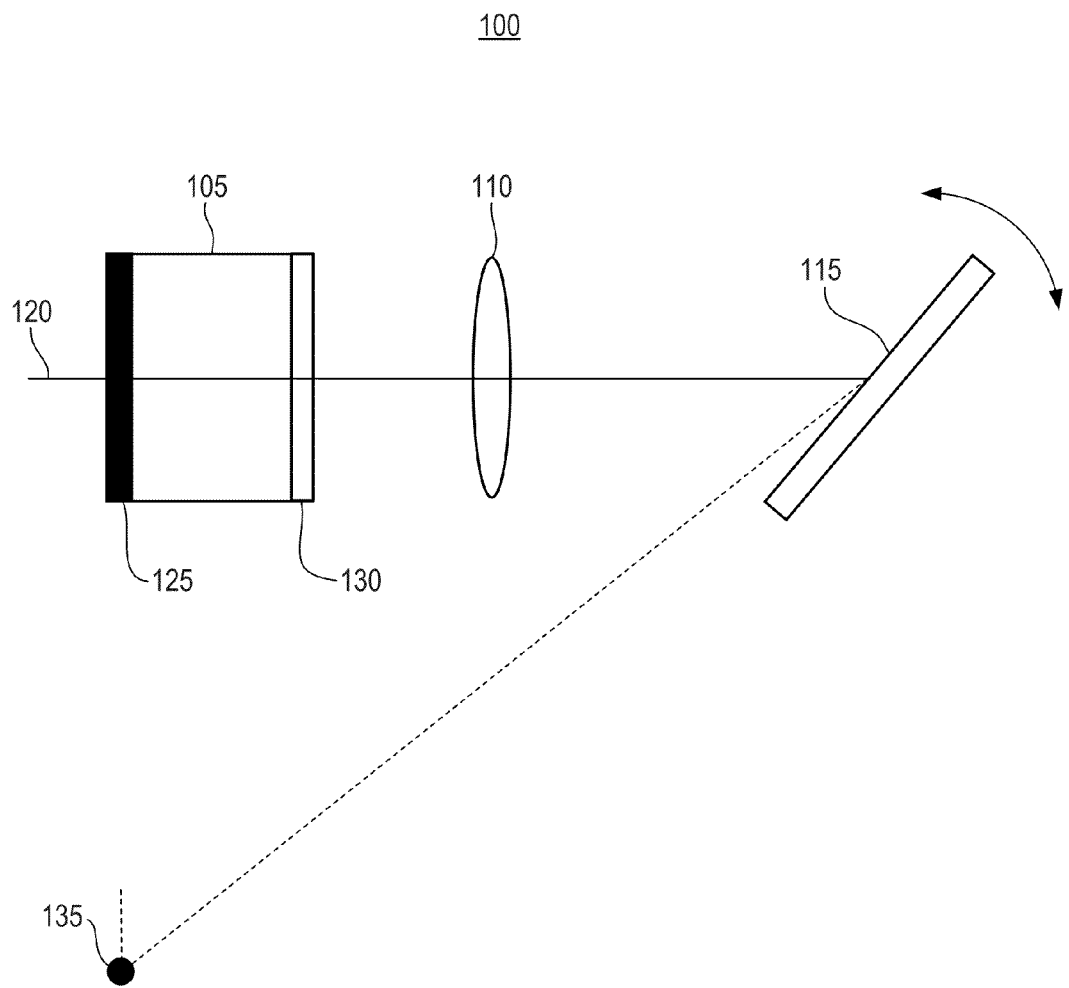
FIG. 1 is a diagram of a conventional laser cavity for a continuously tunable laser.

In certain embodiments, the wavelength filter and the cavity mode tuner are implemented as mechanically separate components, eliminating the need to rotate them about a precisely defined pivot point as in the example of FIG. 1. This mechanical separation can enable increased tuning speed because the elimination of the pivot constraint allows the wavelength filter to be actuated through various alternative control techniques, such as mechanical, micro-electro-mechanical systems (MEMS), piezoelectric, and electro-optic techniques. Moreover, increased tuning speed can also be achieved by rotating the wavelength filter about a center axis rather than a remote pivot point. In other words, the tuning can be performed by a direct drive motor configured to rotate a diffraction grating, mirror, or prism about its own center. This can eliminate certain forms of inertia, such as that of an extended lever arm as in the example of FIG. 1.

In addition, the separation of the wavelength filter and cavity mode tuner can also improve error tolerance by allowing one component to compensate for residual errors in the other. In other words, residual errors of the wavelength filter can be compensated by the cavity mode tuner, and vice versa. The ability to adapt one tuner relative to the other tuner also provides a mechanism to smoothly handle dispersion in the cavity.

In certain embodiments, the cavity mode tuner comprises a phase modulator having finite phase range and configured to create periodic modulation without resets or discontinuities of its drive signal. The elimination of drive resets can improve the performance of the laser because the laser output generally becomes ill-defined during a time when a drive signal is reset.

In various alternative embodiments, the coarse tuner and the fine tuner can be implemented with various alternative tuning mechanisms and configurations. For instance, both the coarse tuner and the fine tuner can be implemented using electronic components, mechanical components, or a combination of mechanical and electronic components. Accordingly, certain embodiments can be implemented using an entirely electronic tuning mechanism, for example. Moreover, in some embodiments, the entire laser cavity can be implemented in a single electronic chip. These and many other alternative embodiments will become clear from the description below.

In the description that follows, certain concepts will be described in the context of external cavity lasers (ECLs). Nevertheless, these concepts are not limited to linear ECLs and can be embodied in other types of lasers, such as ring cavity lasers, double extended cavity lasers, and others.

Figure 2:
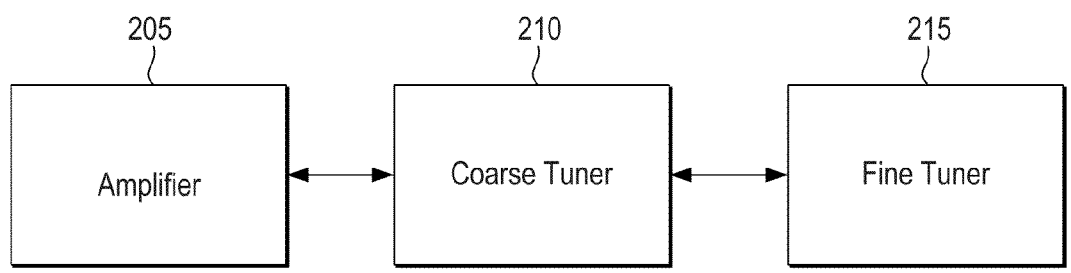
FIG. 2 is a simplified diagram of a laser cavity for a continuously tunable laser according to a representative embodiment.

FIG. 2 is a simplified diagram of a laser cavity for a continuously tunable laser according to a representative embodiment. This diagram provides a simplified representation of a cavity and should not be construed to limit specific details of any of the other embodiments.

Referring to FIG. 2, a cavity 200 comprises an amplifier 205, a first coarse tuner 210 (hereinafter coarse tuner 210) and a second tuner 215 (hereinafter fine tuner 215). Coarse tuner 210 can comprise, for example, a mechanically tuned filter comprising at least one of a diffraction grating, a mirror, and a prism. Although not shown, cavity 200 typically further comprises a mirror on one or both of its ends to recirculate an optical field.

Amplifier 205 can comprise, for example, an SOA such as a diode laser chip. The amplifier 205 typically has an antireflective coating on a side facing the inside of cavity 200, and a partially or fully reflective mirror on a side facing the outside of cavity 200. Amplifier 205 applies a gain to a set of wavelengths selected by coarse tuner 210 and fine tuner 215.

Coarse tuner 210 coarsely selects an emission wavelength of cavity 200, and fine tuner 215 performs fine tuning based on the selected wavelength. For example, coarse tuner 210 can be a wavelength filter that selects a small band of wavelengths using a diffraction grating or some other technique, and fine tuner 215 can be a cavity mode tuner that adjusts an optical path length of cavity 200 according to the selected wavelengths. The combination of these two tuning actions can be used to sweep the emission wavelength across a continuous range of wavelengths white maintaining successive wavelengths in phase with each other. In order to do so, however, their operation must be synchronized.

Because coarse tuner 210 and fine tuner 215 are controlled independently, each tuner can compensate for residual errors in the other. Consequently, cavity 200 may be more tolerant of imperfect assembly compared with cavity 100 of FIG. 1. However, because coarse tuner 210 and fine tuner 215 must be synchronized, their control may be more complicated than that of cavity 100.

Figure 3:
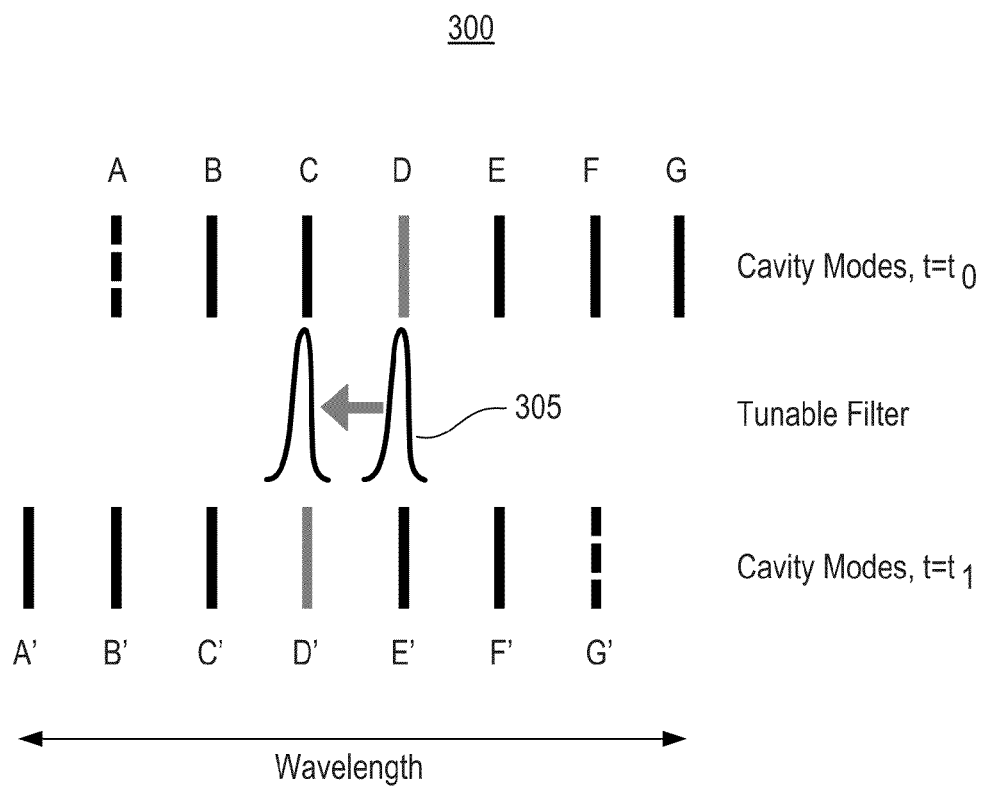
FIG. 3 is a graph of a tuning operation of a laser cavity according to a representative embodiment.

FIG. 3 is a graph of a tuning operation of a laser cavity according to a representative embodiment. For explanation purposes, it will be assumed that the tuning operation is performed by cavity 200 of FIG. 2. However, it could alternatively be performed by another type of cavity or a cavity with a different configuration.

Referring to FIG. 3, a wavelength band 305 represents a set of wavelengths selected by coarse tuner 210, and a set of lines labeled A-G represent cavity modes of cavity 200. These symbols are shown along a wavelength spectrum indicated by a two headed arrow.

At a first time $t_0$, coarse tuner 210 selects a wavelength band 305. This can be accomplished, for example, by rotating a diffraction grating to an angle corresponding to this particular wavelength band. At the first time $t_0$, wavelength band 305 is centered at a cavity mode D of cavity 200. The location of cavity mode D is dictated by the optical length of cavity 200, which can be adjusted through operation of fine tuner 215.

Between the first time $t_0$ and a second time $t_1$, the selected wavelength band 305 is moved to the left, as indicated by a single-headed arrow. In other words, coarse tuner 210 adjusts the selected wavelength band of cavity 200 to a lower range. At the same time, fine tuner 215 adjusts the cavity modes to compensate for this wavelength tuning by changing the length of cavity 200. In particular, fine tuner 215 adjusts the cavity length to shift the cavity modes from the original lines A-G to corresponding new lines A'-G' in coordination with the tuning of the selected wavelength. As a result, cavity mode D, which was aligned with wavelength band 305 at first time $t_0$ is shifted to become cavity mode D' at second time $t_1$, which is still aligned with wavelength band 305 after the shift. Cavity modes D' and C are degenerate, allowing a periodic, finite range, fine tuner 215 to have an endless tuning range by accumulating incremental shifts.

Because a cavity mode always remains aligned with wavelength band 305, the emission wavelength of cavity 200 does not "hop" between different cavity modes as it is tuned. Accordingly, through the synchronized tuning action of coarse and fine tuners 210 and 215, as illustrated in FIG. 3, the emission wavelength can be set to any value along a continuum rather than merely the values corresponding to the discrete cavity modes. This allows cavity 200 to perform continuous tuning, or swept wavelength tuning.

Figure 4:
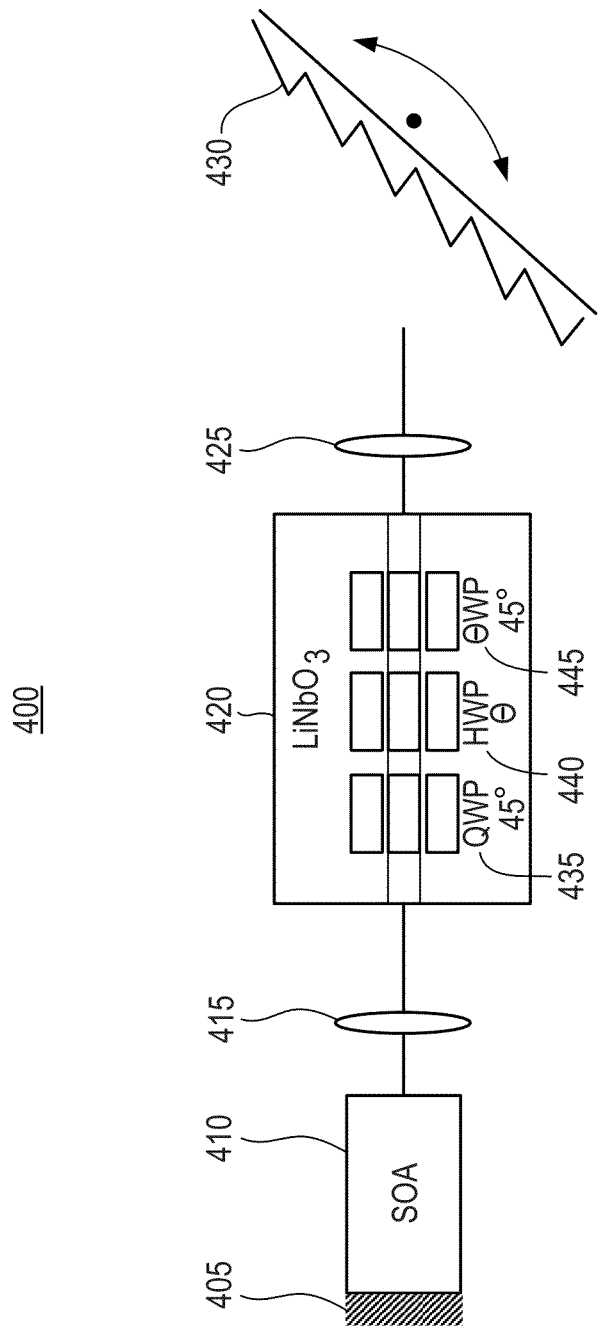
FIG. 4 is a diagram of a laser cavity according to another representative embodiment.

FIG. 4 is a diagram of a laser cavity according to another representative embodiment. This diagram represents a more specific example of cavity 200. Accordingly, descriptions of like functional characteristics may be omitted in order to focus on different or unique features.

Referring to FIG. 4, a cavity 400 comprises an end mirror 405, an SOA 410, a first coupling lens 415, a cavity mode tuner 420, a second coupling lens 425, and a wavelength filter 430.

Wavelength filter 430 comprises a diffraction grating (illustrated by triangle "teeth") that functions as both an end mirror and a coarse tuner. The diffraction grating can be, for instance, a gold coated, e.g., 1100 lines/mm, blazed, highly efficient, single polarization grating at Littrow incidence. As indicated by the double arrow, the diffraction grating can be rotated about a center point rather than an offset pivot point as in FIG. 1. In an example application, wavelength filter 430 may rotate through an angular range of about 10 degrees to about 25 degrees, for instance, to achieve a tuning range of about 200 nm over optical communications wavelengths. Because the center point is stationary, rotation of the diffraction grating does not change the optical length of cavity 400, and therefore it does not change the cavity modes of cavity 400. Additionally, because wavelength filter 430 has no offset pivot point, it can be driven by direct drive motor such as a goniometer or stepper motor.

In accordance with a representative embodiment, cavity mode tuner 420 comprises a three-stage lithium niobate polarization controller, which is an electro-optical tuner. An example of one such stage is described in Thaniyavarn, S., "Wavelength-independent, optical-damage-immune $LiNbO_3$ TE-TM mode converter," *Optics Letters*, volume 11, number 1, 39-41, (1986), the disclosure of which is hereby incorporated by reference. The controller is tuned electronically by sinusoidal drive voltages using the Pockets effect, or the linear Electro-Optical effect. As the drive voltages are cycled through one period, phase is linearly added into cavity 400, continuously adjusting the fine wavelength values of the cavity modes. In other words, the polarization controller linearly advances a phase of an input wavelength, and the advancing is controlled by generating sinusoidal drive voltages in an appropriate manner.

After a single drive period, the intra-cavity phase has advanced from 0 to $2\pi$. Because 0 and $2\pi$ phase are degenerate, and the drive signals have also returned to the same starting point, phase modulation can be cycled again, repeatedly, and endlessly advance the phase, modulo $2\pi$, using reset-free drive signals. In other words, the polarization controller can linearly advance the phase of the input wavelength from 0 to $2\pi$ in each of multiple successive drive periods of sinusoidal drive voltages. Accordingly, cavity 400 can be tuned such that its emission wavelength varies both continuously and in phase across a range larger than supported by a single period of the drive signals. In other words, it can be tuned in a phase-continuous manner.

The stages of the polarization controller comprise electro-optic waveplates configured to perform phase modulation in response to voltages applied to corresponding electrodes. Notably, the electro-optic waveplates may comprise bulk materials or may be processed to contain waveguides. A first stage 435 is configured as a quarter waveplate with a transmission axis at +/−45 degrees, a second stage 440 is configured as a half waveplate with a rotating transmission axis, and a third stage 445 is configured as a quarter waveplate with transmission axis at +/−45 degrees. These waveplate angles are defined relative to an axis of a linear polarization state of a laser beam. An example of a similarly configured device outside the laser context is described in Noe, R. and D. A. Smith, "Integrated-optic rotating waveplate frequency shifter," *Electronics Letters*, v 24, n 21, 1348-1349, (1988), the disclosure of which is hereby incorporated by reference. The crystal structure of lithium niobate (trigonal, 3 m) makes it attractive for implementing the rotating waveplate of second stage 440. However, lithium niobate could also be substituted by another material having the same crystalline structure, such as lithium tantalate.

The light that enters cavity mode tuner 420 is linearly polarized. After traversing the quarter-waveplate of first stage 435, the light becomes circularly polarized. Next, the light passes through the rotating half-waveplate of second stage 440, which changes the orientation of the polarization vector (i.e., changes the direction of rotation of the polarization vector) and produces a phase shift that can be described mathematically by a Jones matrix. The magnitude of the phase shift can be generally controlled by changing the angle of the transmission axis of the half waveplate. Accordingly, the rotation angle can be controlled as needed to compensate for a shift in the wavelength selected by wavelength filter 430. After the light exits second stage 440, it is reconditioned in the quarter-waveplate of third stage 445 so that it is linearly polarized as it travels though cavity 400.

As an alternative to using electro-optic waveplates, cavity mode tuner 420 could be implemented using bulk-optic waveplates (e.g., birefringent crystals). For example, the cavity mode tuner 420 could be implemented with a mechanical configuration analogous to FIG. 4, using quarter waveplate, followed by a half waveplate, and then another quarter wavelength. The phase delay in such a configuration can be adjusted by mechanically rotating the half waveplate and, accordingly, the transmission axis of the half waveplate. In still other alternative embodiments, cavity mode tuner 420 could be implemented by a combination of bulk-optic waveplates and electro-optic waveplates. Moreover, the waveplates can comprise three or more waveplate stages arranged in series. In yet other embodiments, the waveplates can be optical-ceramic waveplates, liquid crystal waveplates, or various other types of waveplates.

One benefit of using electro-optic waveplates rather than mechanical waveplates is that they have much faster modulation rates (>1000×) compared with mechanically adjusted waveplates. In addition, they can be actively controlled to ensure achromatism, they can be integrated into a single device with fewer surfaces/etalons, and an intra-cavity waveguide can help to narrow the filter width and enhance laser side-mode-suppression-ratios.

In both the electro-optic and bulk-optics configurations, the half-waveplate changes the position of the cavity modes, which is the conceptual equivalent of shifting the discrete comb lines illustrated in FIG. 3. This is accomplished through electronic control of an electro-optic half-waveplate or rotation of a bulk-optics half-waveplate about its axis. At the same time, the position of wavelength filter 430 determines which one of the cavity modes is active at any time. Accordingly, a continuous wavelength sweep can be accomplished by synchronizing the tuning of wavelength filter 430 and cavity mode tuner 420 through an electronic or mechanical control scheme.

Another way to view the operation of cavity mode tuner 420 is through the concept of frequency conversion. In particular, as light passes through the waveplates, the rotation of the middle plate changes the phase of the light over time, producing the equivalent of a frequency shift. Accordingly, the frequency of the light can be upshifted or downshifted based on a direction and speed of rotation of the middle waveplate. The magnitude of the frequency shift can be, for instance, 1 MHz. Moreover, during a tuning operation, if the light experiences a slight frequency shift each time it recirculates through cavity 400, its wavelength can be continuously swept according to the shift. In other words, it is swept by an accumulation of incremental shifts.

In addition to facilitating phase-continuous tuning, cavity mode tuner 420 can also be used to actively stabilize the lasing wavelength of the cavity 400. For example, as vibrations and thermal effects perturb the optical length of the laser cavity, wavelength fluctuations may be seen at its output. Accordingly, cavity mode tuner 420 can be actively tuned to compensate and cancel these cavity length changes, leading to a more stable wavelength output.

As indicated above, the tuning of wavelength filter 430 must be synchronized with the tuning of cavity mode tuner 420 in order to perform phase-continuous tuning. This can be accomplished in any manner that maintains the alignment between the selected wavelengths and the cavity modes as illustrated in FIG. 3. For instance, this can be accomplished by applying simultaneous control signals to the diffraction grating and the lithium niobate polarization controller, and using calibration to identify the values of those control signals that are necessary to achieve proper alignment. This process can be performed, for instance, using various forms of feedback and/or trial and error with predetermined tuner trajectories.

Another way to synchronize the tuning of the coarse tuner and the fine tuner is to fix a motor position trajectory for wavelength filter 430, and then control the frequency shifting behavior of cavity mode tuner 420 to follow the motor position as indicated by a measurement device such as an encoder wheel. Alternatively, wavelength filter 430 can be designed to follow the behavior of cavity mode tuner 420 through a similar mechanism. Yet another way to synchronize the tuning of the coarse tuner and the fine tuner is by generating an error signal that indicates when they are getting out of synch, and using a feedback loop on the error signal to adjust the tuning of one or both components relative to the other.

The components and configuration of cavity 400 can be modified in various ways to create alternative embodiments. For example, the diffraction grating can be replaced by another type of grating filter, such as a compound grating, or a polygon scanner. It can also be arranged in an alternative configuration, such as a Littman-Metcalf configuration rather than a Littrow configuration. The diffraction grating can also be replaced by another type of wavelength filter, such as a tunable array waveguide grating (AWG), a tunable Fabry-Perot (FP) filter, a tunable Virtually Imaged Phase Array (VIPA), a tunable Lyot/Solc filter, acousto-optic fitter, or tunable interference filter. As another example, the wavelength tuning performed by the diffraction grating could alternatively be performed by two cavity mode tuners in parallel, using a Vernier tuning scheme such as that described below with reference to FIG. 6.

FIGS. 5-9 illustrate additional embodiments of a laser cavity for a phase-continuous tunable laser. These embodiments can provide benefits such as an ability to perform tuning without mechanical drive mechanisms, or to form an electronically tunable laser cavity on a single chip. For instance, in some embodiments, a gain stage and first and second tuners form an electronically tunable laser cavity on a single chip. The embodiments of FIGS. 5-9 are shown with some features already described in relation to cavity 400, so a redundant description of these features may be omitted in order to focus on the differences in their respective descriptions. In addition, certain functional aspects of these embodiments may be the same or similar to functions described in relation to FIG. 4. Accordingly, repetitive descriptions of these functions are generally not repeated as well.

Figure 5:
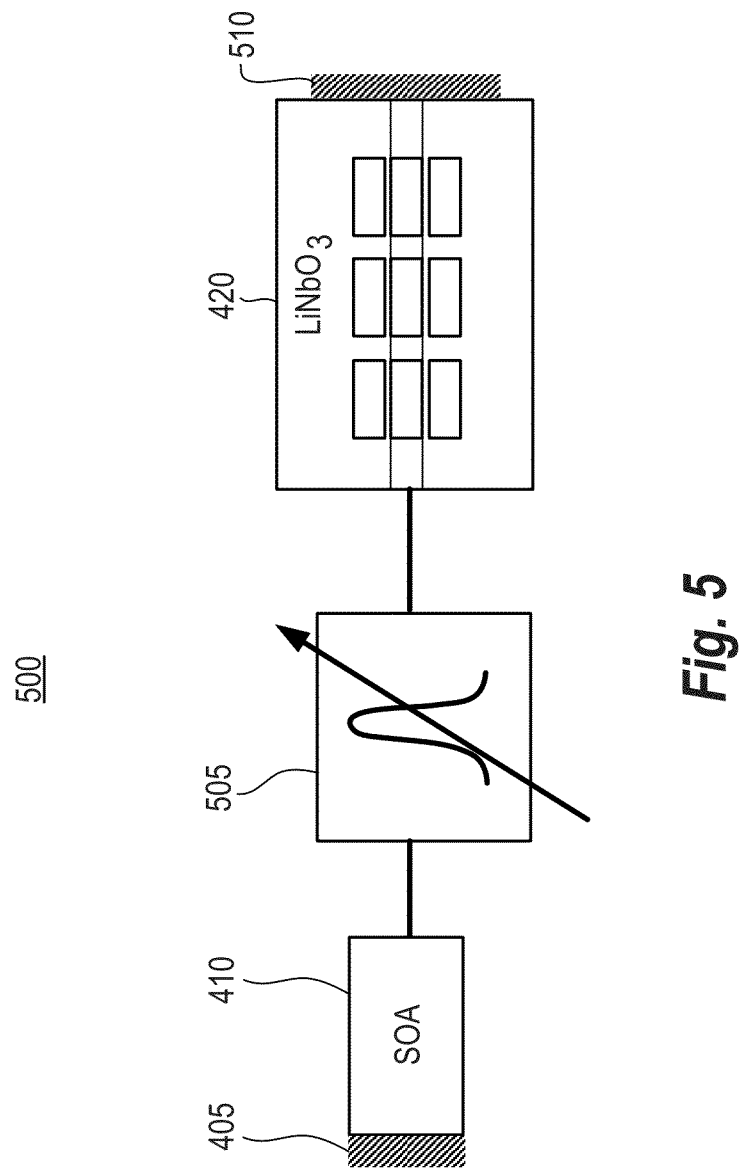
FIG. 5 is a diagram of a laser cavity according to another representative embodiment.

FIG. 5 is a diagram of a laser cavity 500 according to another representative embodiment. In this embodiment, the grating filter of cavity 400 is replaced by another tunable wavelength filter 505, and a second end mirror 510 is placed adjacent to cavity mode tuner 420.

Tunable wavelength filter 505 can take various alternative forms, such as a tunable AWG, a tunable FP filter, a tunable VIPA, a tunable Lyot/Solc filter, or a tunable interference filter. The use of these alternative technologies may allow electronic tuning for coarse wavelength selection, potentially simplifying the operation of laser cavity 500 compared with cavity 400. Another potential benefit of these alternative technologies is that they may enable higher sweep speeds and allow for shorter, more integrated cavities.

Figure 6:
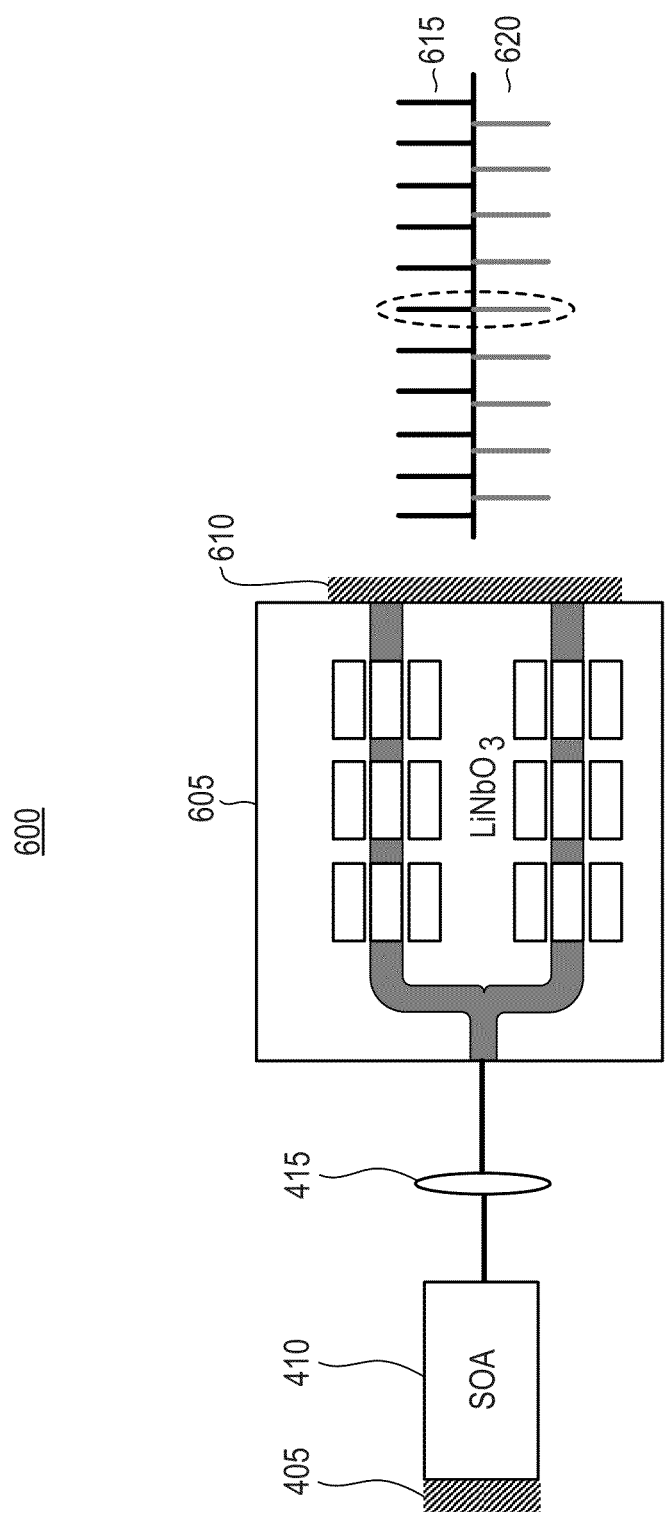
FIG. 6 is a diagram of a laser cavity according to another representative embodiment.

FIG. 6 is a diagram of a laser cavity 600 according to another representative embodiment. In this embodiment, coarse and fine wavelength tuning are performed by a single tuning unit 605 comprising two cavity mode tuners, and a second end mirror 610 is located adjacent to tuning unit 605 to recirculate light through laser cavity 600.

The two cavity mode tuners are arranged in parallel in a lithium niobate substrate. Through these two tuners, laser cavity 600 is split from a linear cavity into upper and lower arms, in a Y configuration. These two cavities allow laser cavity 600 to be tuned electronically using a Vernier tuning scheme, which is illustrated in FIG. 6 by an upper comb function 615 corresponding to the upper arm and a lower comb function 620 corresponding to the lower arm. As illustrated by these comb functions, the upper and lower arms have slightly different optical lengths, so they only reinforce each other at one specific mode position at a time. In FIG. 6, this position is indicated by a dotted oval, and it can be shifted by tuning the upper and lower cavities in synchronization to perform a phase-continuous wavelength sweep.

With Vernier tuning there is a tradeoff between free-spectral range and resolution. Accordingly, to simultaneously get more of each, additional parallel cavities can be added. For example, instead of having only two cavities as shown in FIG. 3, tuning unit 605 could be modified to have three or more parallel cavities with a single point of mutual alignment.

Figure 7:
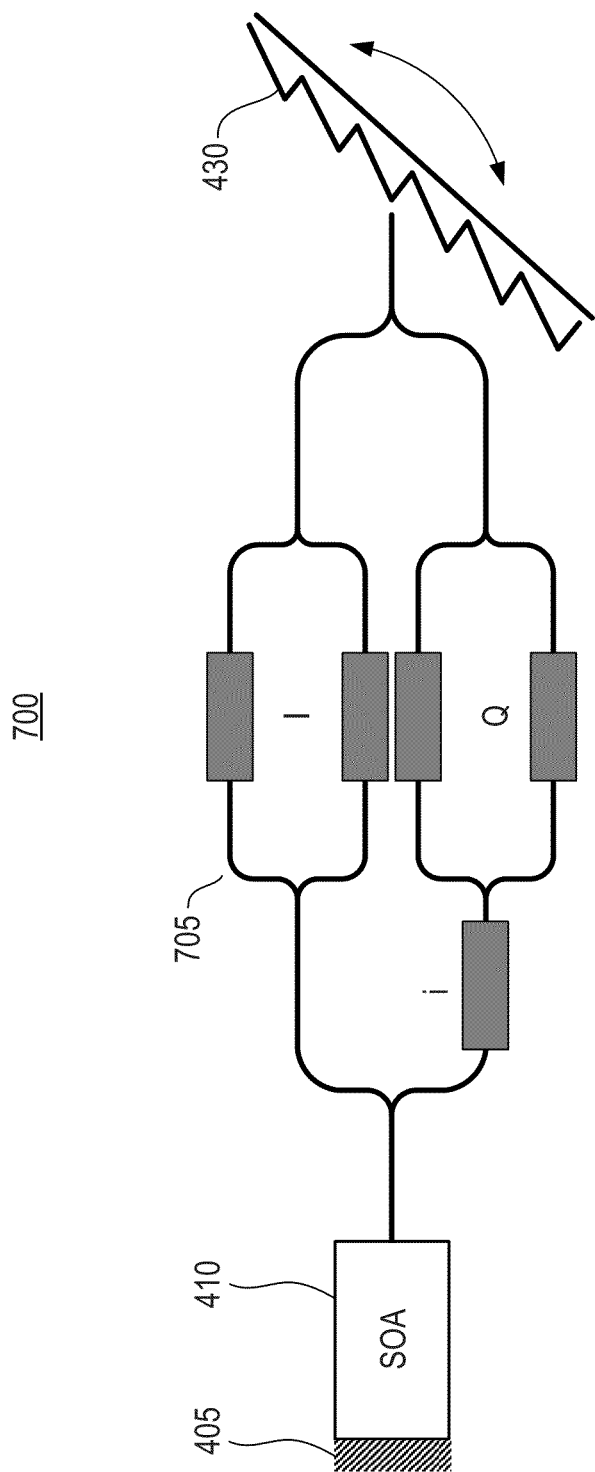
FIG. 7 is a diagram of a laser cavity according to another representative embodiment.

FIG. 7 illustrates a laser cavity 700 according to yet another representative embodiment. In this embodiment, the cavity-mode tuner is implemented by a push-pull I-Q modulator 705.

Push-pull I-Q modulator 705 is generally less attractive than the lithium niobate polarization controller of cavity 400 because it adds loss (e.g., 6 dB) for each pass through the laser cavity 700. Moreover, while its drive signals are periodic and reset-free, they do have a cusp (i.e., triangle waves and a discontinuous first derivative). One benefit, however, is that push-pull I-Q modulator 705 does not depend upon the crystal structure of lithium niobate and can be implemented in a wider variety of materials. For example, InP and GaAs are two such materials as they are also used as the substrate materials for laser gain chips.

FIGS. 8A through 8D are diagrams of laser cavities according to still other representative embodiments. In these embodiments, different forms of gratings and/or grating configurations are used in combination with cavity mode tuner 420.

Figure 8A:
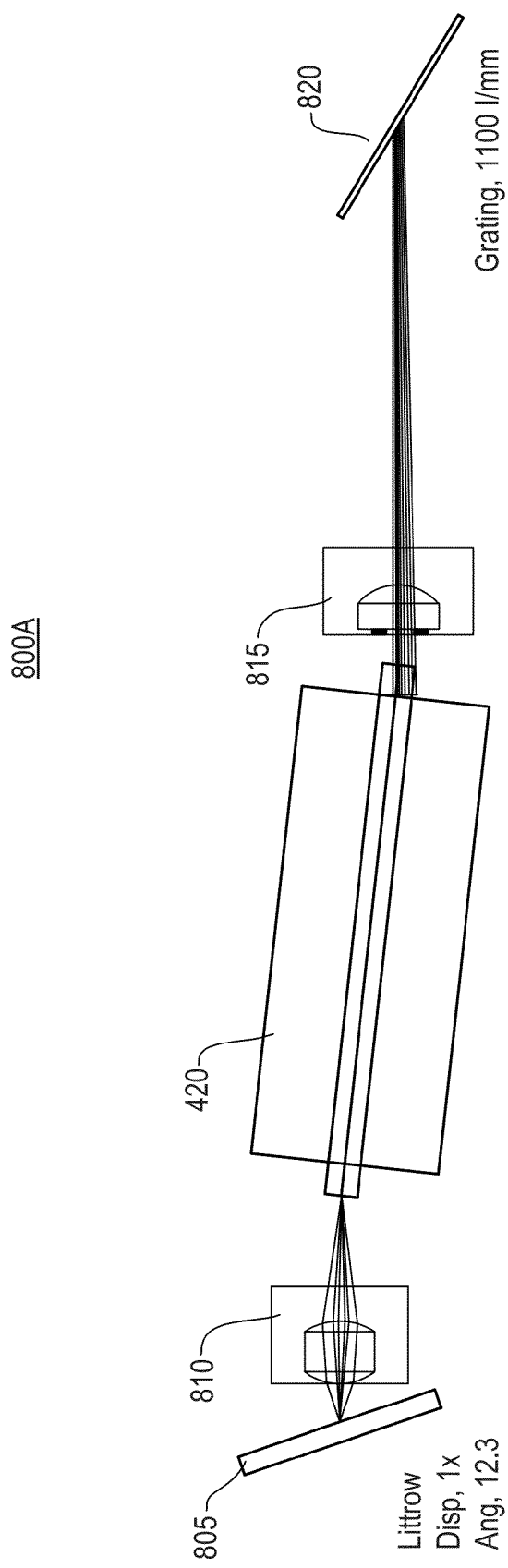
FIGS. 8A through 8D are diagrams of laser cavities according to still other representative embodiments.

Referring to FIG. 8A, a cavity 800A comprises an end mirror 805, coupling optics 810, cavity mode tuner 420, coupling optics 815, and a retro-reflector type diffraction grating ("diffraction grating") 820. Cavity 800A functions similar to cavity 400 of FIG. 4, and it also has a Littrow configuration.

As indicated by the labels in FIG. 8A, diffraction grating 820 is oriented at a Littrow angle and has a groove density of about 1100 lines per millimeter (lines/mm). This configuration is considered to produce 1× resolution so it can be used as a reference for comparison with other configurations.

Figure 8B:
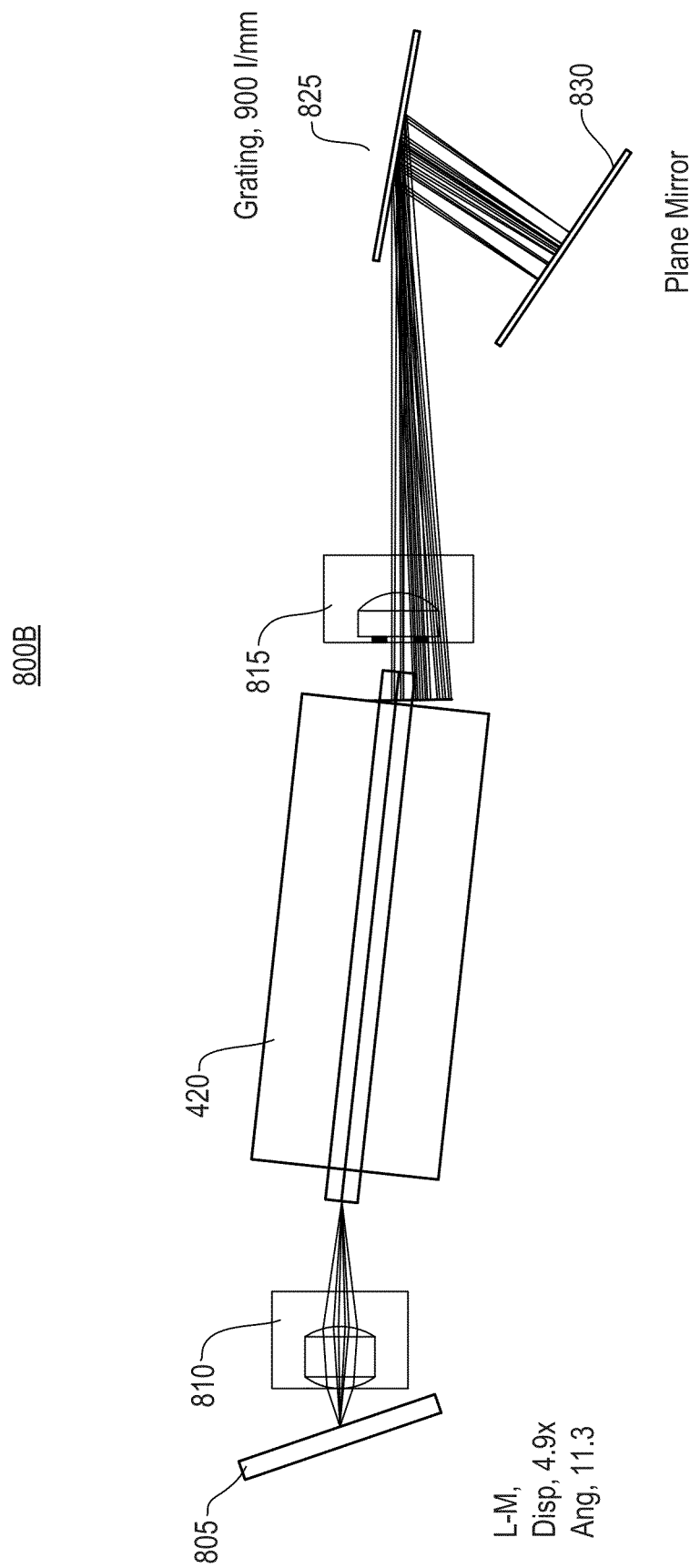

Referring to FIG. 8B, a cavity 800B is similar to cavity 800A, but it replaces the single diffraction grating 820 with a diffraction grating 825 and a plane mirror 830. This configuration is referred to as a Littman-Metcalf (L-M) configuration.

As indicated by the labels in FIG. 8B, diffraction grating 825 is oriented at a grazing incidence angle and it has a groove density of about 900 lines/mm, with about 5× resolution.

Figure 8C:
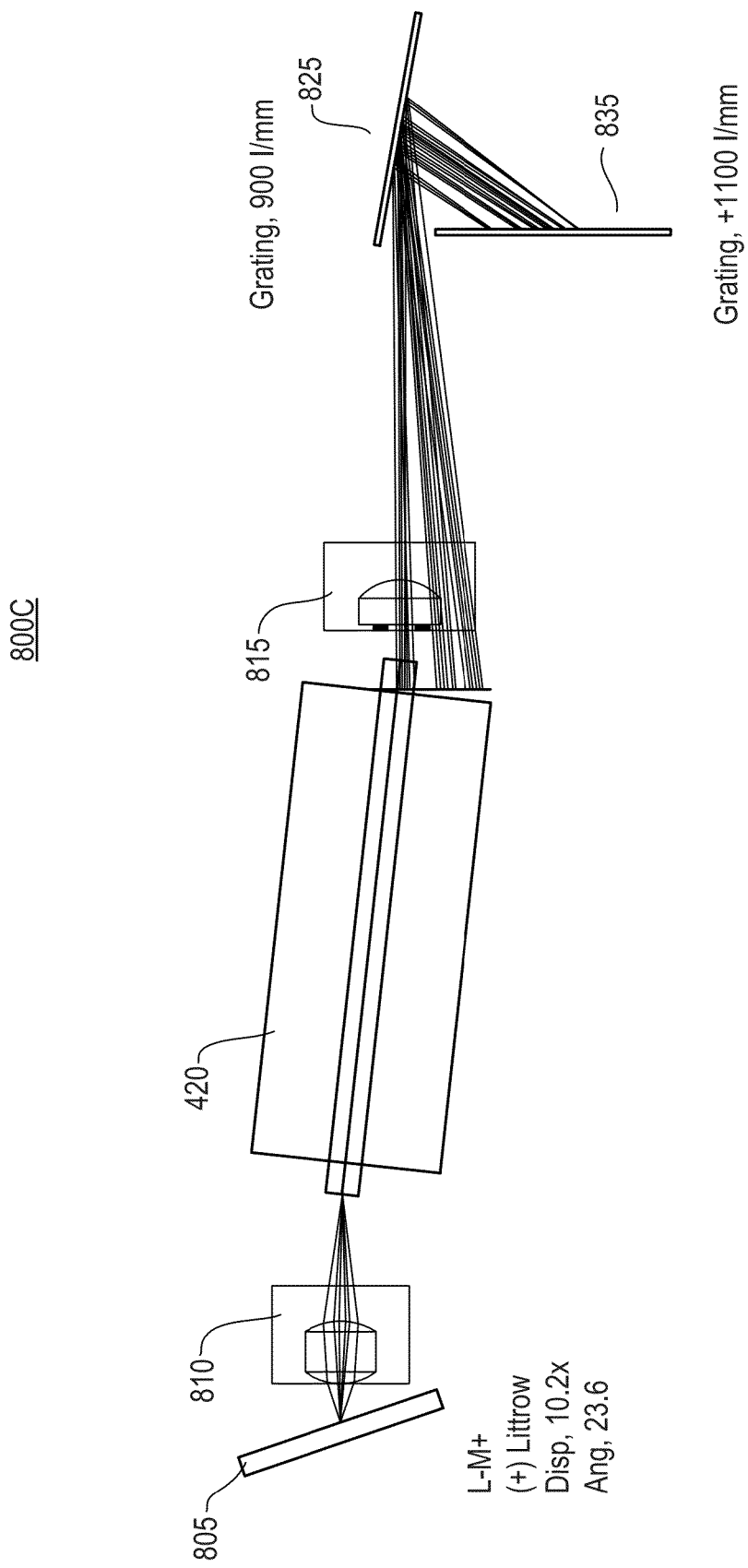

Referring to FIG. 8C, a cavity 800C is similar to cavity 800A, but it replaces the diffraction grating 820 with diffraction grating 825 and a retro-reflector type diffraction grating ("diffraction grating") 835. In this configuration, diffraction grating 825 (a first diffraction grating) is configured to disperse an optical field of the laser, and diffraction grating 835 (a second diffraction grating) functions as a retro-reflector for the optical field dispersed by diffraction grating 825 and is configured to further disperse the optical field. This configuration can be viewed as a hybrid of the Littrow configuration and the Littman-Metcalf configuration, and it is labeled L-M (+) Littrow in FIG. 8C.

As indicated by the labels in FIG. 8C, diffraction grating 825 is oriented at a grazing incidence angle. Diffraction grating 835 has groove density of 900 lines/mm, and diffraction grating 835 has a groove density of 1100 lines/mm. When combined, diffraction gratings 825, 835 provide about 10× resolution. Accordingly, the combination of diffraction gratings 825, 835 provides significantly higher resolution with diffraction grating 820.

Figure 8D:
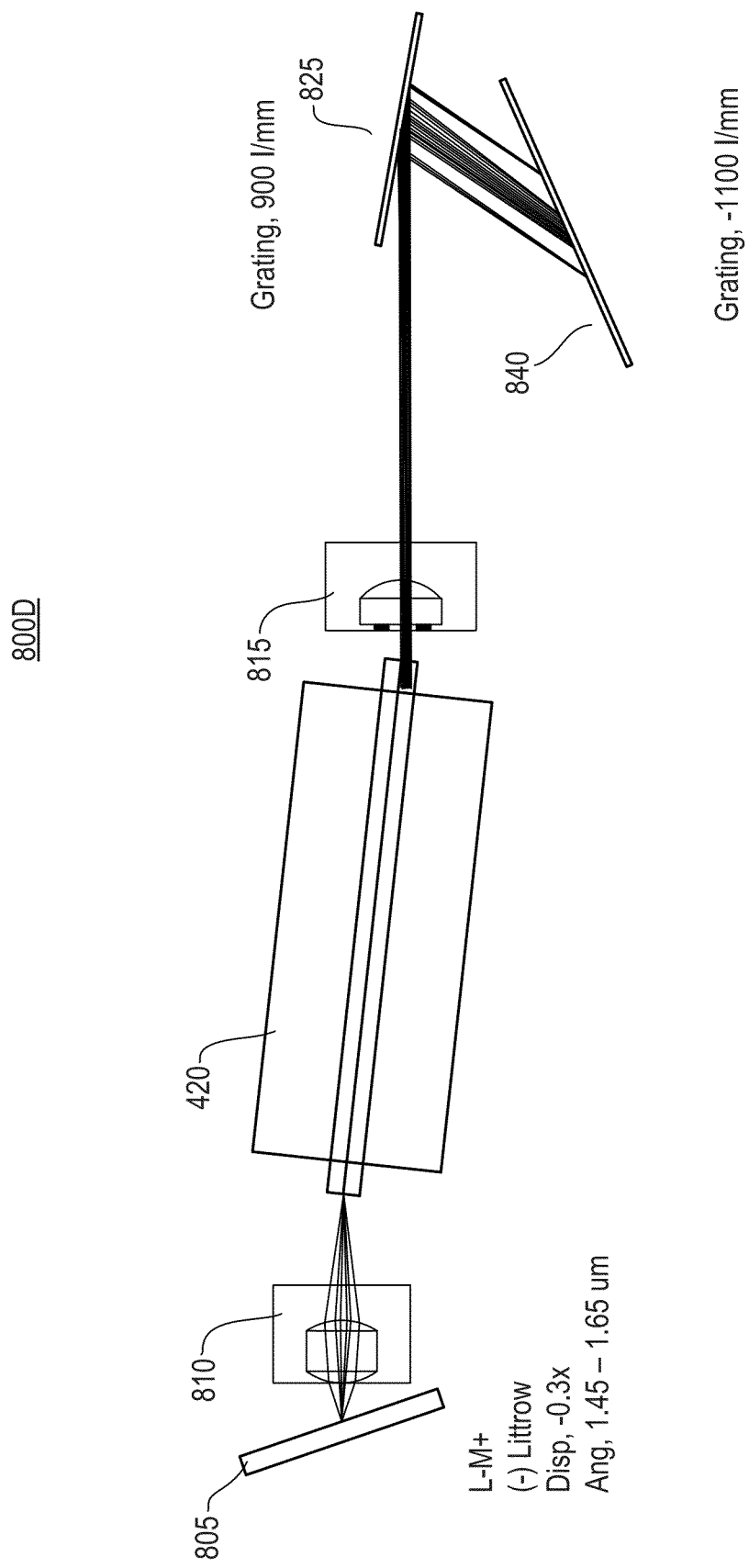

Referring to FIG. 8D, a cavity 800D is similar to cavity 800A, but it replaces diffraction grating 820 with diffraction grating 825 and a retro-reflector type diffraction grating ("diffraction grating") 840. This configuration can also be viewed as a hybrid of the Littrow configuration and the Littman-Metcalf configuration, and it is labeled L-M (−) Littrow in FIG. 8D.

As indicated by the labels in FIG. 8D, diffraction gratings 825 and 840 have groove densities of 900 lines/mm and −1100 lines/mm, respectively, resulting in −0.3× resolution. Together, these gratings produce a tunable, spectrally broadened, low coherence source.

Figure 9:
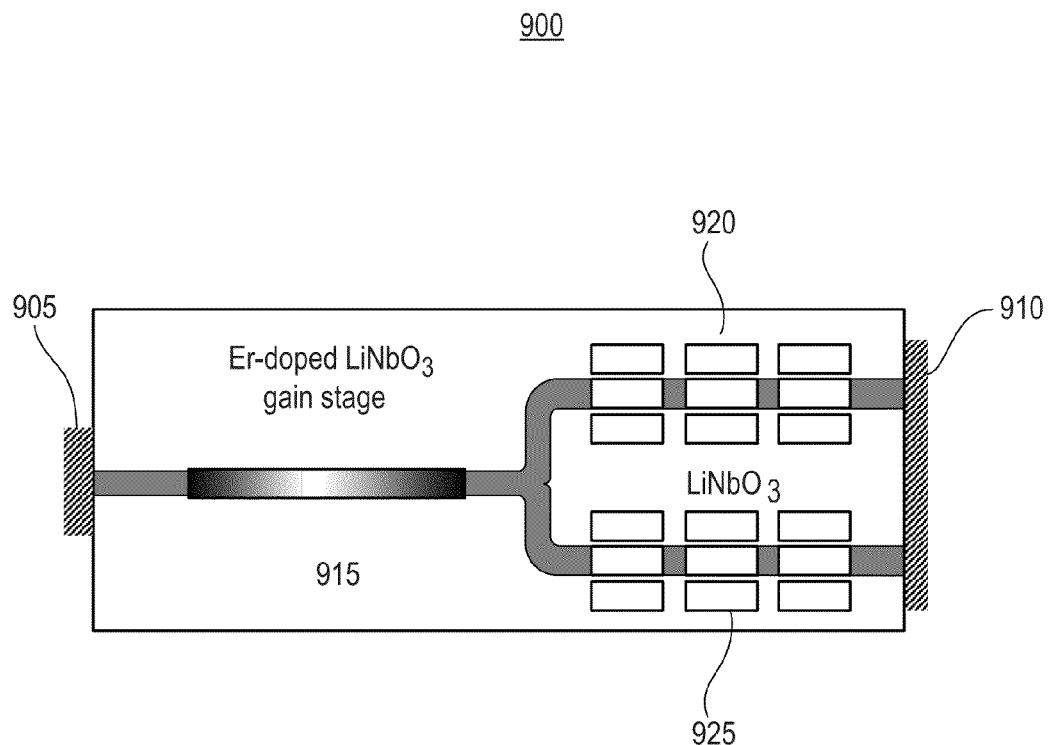
FIG. 9 is a diagram of a laser cavity according to another representative embodiment.

FIG. 9 illustrates a laser cavity 900 according to another representative embodiment. Unlike the other embodiments, laser cavity 900 is formed in a single integrated chip. It uses the Vernier-tuning approach of FIG. 6 by transmitting light through two or more parallel cavities.

Referring to FIG. 9, laser cavity 900 comprises first and second end mirrors 905 and 910, a gain stage 915, and first and second cavity mode tuners 920 and 925. Second end mirror 905 is typically a partially reflective mirror allowing emission of a selected wavelength. First and second cavity mode tuners 920 and 925 can each be implemented similar to cavity mode tuner 420 described with reference to FIG. 4. Accordingly, they can use electro-optic waveplates to perform both coarse and fine tuning as explained in the description of FIG. 6. Gain stage 915 is configured to amplify the optical field in laser cavity 900 and can be implemented, for instance, as an erbium-doped waveguide section of a lithium niobate substrate.

In a variation of the embodiment shown in FIG. 9, gain stage 915 could alternatively be implemented in a indium phosphide (InP) substrate, with the gain coming from indium gallium arsenide phosphide (InGaAsP) diode structures. In such an embodiment, coarse and fine tuning could be performed using the Vernier tuning technique with parallel I-Q modulators as illustrated in FIG. 7. Moreover, in various alternative embodiments, other substrates of III-V semiconductor materials can be used in combination with I-Q modulators.

Figure 10:
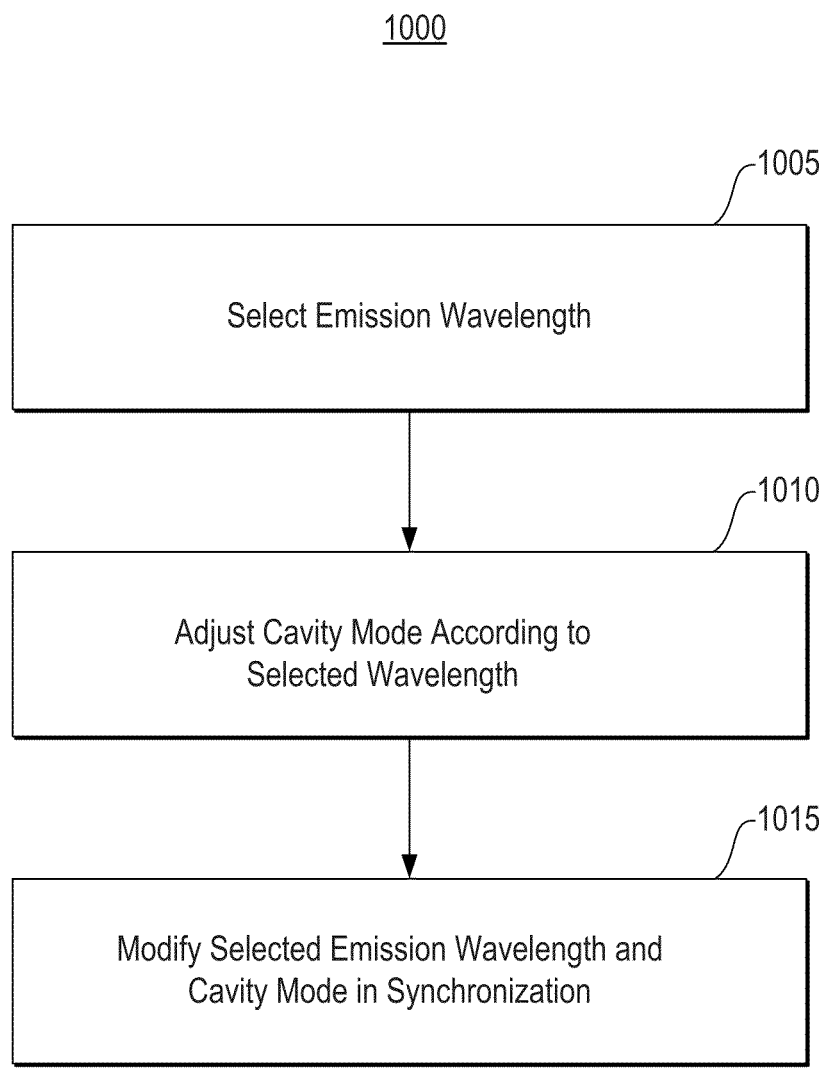
FIG. 10 is a flowchart illustrating a method of tuning a continuously tunable laser according to a representative embodiment.

FIG. 10 is a flowchart illustrating a method 1000 for tuning a continuously tunable laser according to a representative embodiment. This method could be used in conjunction with any of the embodiments described with respect to FIGS. 2-9, with specific steps being adapted for the different structures included in those embodiments. In the description of FIG. 10, example method steps are indicated by parentheses to distinguish them from example device or system features.

Referring to FIG. 10, the method begins by controlling a coarse tuner to select an emission wavelength of the laser. In synchronization with step 1005, a fine tuner adjusts a cavity mode of the laser according to the selected emission wavelength (1010). Then, the coarse and fine tuners are controlled in synchronization with each other to modify the selected emission wavelength in a phase-continuous manner (1015).

The method steps of FIG. 10 can be implemented using any of various techniques described above in relation to FIGS. 2-9. For instance, as described above, a coarse tuner can comprise a diffraction grating having a center of rotation, wherein the selected wavelength is controlled by rotating the diffraction grating about the center of rotation. As another example, as described above, each of the coarse and fine tuners can be used to compensate for errors in the other. For instance, the fine tuner may compensate for errors by detecting a tuning error of the coarse tuner and adjusting its tuning according to the detected error.

As indicated by the foregoing, the representative embodiments can potentially improve various aspects of phase-continuous tunable lasers, such as their speed of operation, their error tolerance. In addition, certain embodiments improve tuning specificity through the use of highly dispersive grating arrangements. Moreover, some embodiments provide an entire cavity in a single chip, which can potentially simplify the design and control mechanisms of the cavity.

While representative embodiments are disclosed herein, one of ordinary skill in the art appreciates that many variations that are in accordance with the present teachings are possible and remain within the scope of the appended claims. The invention therefore is not to be restricted except within the scope of the appended claims.

The invention claimed is:

1. A tunable laser, comprising:
   a first tuner configured to select an emission wavelength of the laser;
   a second tuner comprising: a polarization controller comprising waveplates, at least one of which is rotated to linearly advances a phase of an input wavelength from 0 to $2\pi$ in successive drive periods of sinusoidal drive voltages, the second tuner configured to adjust a cavity mode of the laser by modifying the cavity optical path length, wherein the second tuner is constrained by a finite tuning range; and
   a controller configured to control the first and second tuners to select the emission wavelength and adjust the cavity mode in synchronization to perform phase-continuous tuning across a range larger than supported by the finite tuning range of the second tuner.

2. The tunable laser of claim 1, wherein the first tuner comprises a mechanically tuned filter comprising at least one of a diffraction grating, a mirror, and a prism.

3. The tunable laser of claim 2, further comprising a direct drive motor configured to rotate the diffraction grating, mirror, or prism about its own center.

4. The tunable laser of claim 1, wherein the waveplates comprise electro-optic waveplates.

5. The tunable laser of claim 1, wherein the waveplates comprise bulk-optic waveplates.

6. The tunable laser of claim 1, wherein the waveplates comprise a combination of bulk-optic waveplates and electro-optic waveplates.

7. The tunable laser of claim 1, wherein the first tuner comprises an electro-optical tuner.

8. The tunable laser of claim 4, wherein the second tuner comprises a lithium niobate polarization controller.

9. The tunable laser of claim 4, wherein the waveplates comprise optical-ceramic waveplates.

10. The tunable laser of claim 4, wherein the waveplates comprise liquid crystal waveplates.

11. The tunable laser of claim 1, wherein the first tuner comprises a first diffraction grating configured to disperse an optical field of the laser, and a second diffraction grating that functions as a retro-reflector for the optical field dispersed by the first diffraction grating and is configured to further disperse the optical field.

12. A method of operating a tunable laser comprising a first tuner and a second tuner, comprising:
controlling the first tuner to select an emission wavelength of the laser;
controlling the second tuner by generating drive voltages, to adjust a cavity mode of the laser by modifying the cavity optical path length by linearly advancing an intra-cavity phase of the laser from 0 to $2\pi$ in successive drive periods of the sinusoidal drive voltages, wherein the second tuner is constrained by a finite tuning range; and
controlling the first and second tuners in synchronization with each other to modify the selected emission wavelength in a phase-continuous manner across a range that is larger than supported by the finite tuning range of the second tuner, wherein the second tuner comprises waveplates, and adjusting the cavity mode comprises rotating at least one of the waveplates in synchronization with selection of the emission wavelength of the laser.

13. The method of claim 12, wherein the first tuner comprises a mechanically tuned filter comprising at least one of a diffraction grating, a mirror, and a prism, and controlling the first tuner comprises rotating the diffraction grating, mirror, or prism about its own center.

14. The method of claim 13, further comprising detecting a tuning error of one of the first tuner and the second tuner, and tuning the other tuner to compensate for the tuning error.

15. A tunable laser, comprising:
a first tuner comprising a first I-Q modulator, the first tuner configured to select an emission wavelength of the laser;
a second tuner comprising a second I-Q modulator, the second tuner configured to adjust a cavity mode of the laser by modifying the cavity optical path length, wherein the second tuner is constrained by a finite tuning range;
a gain stage comprising an erbium-doped waveguide section of a substrate, and configured to amplify an optical field, wherein the gain stage and the first and second tuners form an electronically tunable laser cavity on a single chip comprising a lithium niobate substrate and a semiconductor; and
a controller configured to control the first and second tuners to select the emission wavelength and adjust the cavity mode in synchronization to perform phase-continuous tuning across a range larger than supported by the finite tuning range of the second tuner.

16. A tunable laser, comprising:
a first tuner configured to select an emission wavelength of the laser;
a second tuner configured to adjust a cavity mode of the laser by modifying the cavity optical path length, the first and second tuners comprising first and second cavity mode tuners arranged in parallel and configured to perform coarse and fine wavelength tuning using Vernier tuning scheme, wherein the second tuner is constrained by a finite tuning range;
a gain stage comprising an erbium-doped waveguide section of a substrate, and configured to amplify an optical field, wherein the gain stage and the first and second tuners form an electronically tunable laser cavity on a single chip comprising a lithium niobate substrate; and
a controller configured to control the first and second tuners to select the emission wavelength and adjust the cavity mode in synchronization to perform phase-continuous tuning across a range larger than supported by the finite tuning range of the second tuner.

* * * * *